(12) United States Patent
Koehler et al.

(10) Patent No.: US 7,897,450 B2
(45) Date of Patent: Mar. 1, 2011

(54) METHOD FOR ENCAPSULATING A HIGH-K GATE STACK BY FORMING A LINER AT TWO DIFFERENT PROCESS TEMPERATURES

(75) Inventors: Fabian Koehler, Dresden (DE); Katy Schabernack, Spremberg (DE); Falk Graetsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/355,250

(22) Filed: Jan. 16, 2009

(65) Prior Publication Data

US 2009/0242999 A1 Oct. 1, 2009

(30) Foreign Application Priority Data

Mar. 31, 2008 (DE) .......................... 10 2008 016 437

(51) Int. Cl.
*H01L 21/8249* (2006.01)
(52) U.S. Cl. ... 438/216; 438/591; 438/791; 257/E21.626
(58) Field of Classification Search .................. 438/216, 438/591, 303, 595, 791; 257/E21.626
See application file for complete search history.

(56) References Cited

U.S. PATENT DOCUMENTS

| 6,228,721 | B1 | 5/2001 | Yu | 438/275 |
|---|---|---|---|---|
| 6,245,620 | B1 * | 6/2001 | Jang et al. | 438/303 |
| 6,281,075 | B1 | 8/2001 | Yuan et al. | 438/257 |
| 2002/0197789 | A1 * | 12/2002 | Buchanan et al. | 438/240 |
| 2003/0181015 | A1 * | 9/2003 | Komatsu | 438/303 |

OTHER PUBLICATIONS

Translation of Official Communication from German Patent Office for German Patent Application No. 10 2008 016 437.2-33 dated Nov. 18, 2008.

* cited by examiner

*Primary Examiner* — Thanhha Pham
(74) *Attorney, Agent, or Firm* — Williams, Morgan & Amerson

(57) ABSTRACT

Encapsulation of a gate stack comprising a high-k dielectric material may be accomplished on the basis of a silicon nitride material that is deposited in a sequence of two deposition processes, in which the first process may be performed on the basis of a moderately low process temperature, thereby passivating sensitive surfaces without unduly contaminating the same, while, in a second deposition process, a moderately high process temperature may be used to provide enhanced material characteristics and a reduced overall cycle time compared to conventional ALD or multi-layer deposition techniques.

8 Claims, 4 Drawing Sheets

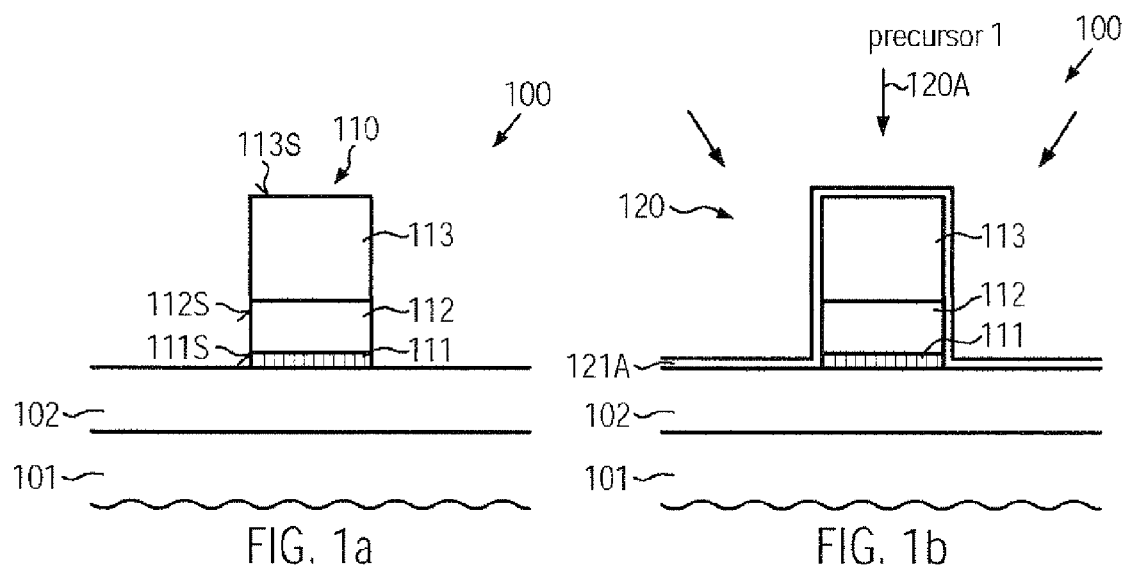
FIG. 1a
FIG. 1b
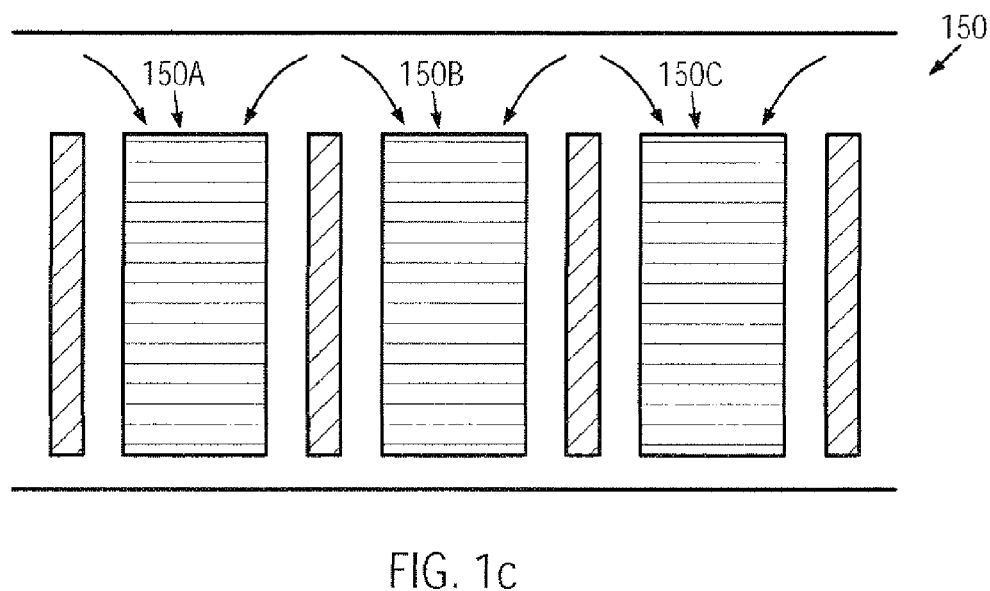
FIG. 1c

US 7,897,450 B2

METHOD FOR ENCAPSULATING A HIGH-K GATE STACK BY FORMING A LINER AT TWO DIFFERENT PROCESS TEMPERATURES

BACKGROUND OF THE INVENTION

1. Field of the Invention

Generally, the present disclosure relates to the fabrication of highly sophisticated integrated circuits including advanced transistor elements that comprise highly capacitive gate structures including a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, silicon dioxide is preferably used as a gate insulation layer in field effect transistors that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance-driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$) with a k of approximately 25, strontium titanium oxide (Sr- $TiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region so as to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll off, and also reducing significant variations of transistor performance with a variation in gate length. Since the threshold voltage of the transistors is significantly determined by the work function of the metal-containing gate material, an appropriate adjustment of the effective work function with respect to the conductivity type of the transistor under consideration has to be guaranteed.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, thereby offsetting many of the advantages of the high-k dielectric in combination of the metal material. It is believed that the deterioration of the high-k metal gate is substantially caused by the incorporation of oxygen and a respective oxygen diffusion within the high-k dielectric material, wherein the oxygen diffusion may be fed by oxygen contained in the ambient and in any neighboring materials, such as silicon dioxide and the like, that may come into contact with the high-k dielectric during the processing of the devices. Since, for instance, hafnium- and zirconium-based oxides grow very fast due to the high affinity to oxygen even at moderately high temperatures, a significant modification of the characteristics of the high-k dielectric material may be observed, for instance, an increased layer thickness and thus a reduced dielectric constant, which may be even further pronounced at moderately high temperatures of approximately 950-1300° C., as may typically be used during activation treatments and the like.

In addition to a significant modification of the high-k dielectric material, the work function of the metal in the gate stack may also be shifted towards the center of the band gap, thereby modifying the threshold voltage of respective transistors. Due to the high oxygen affinity of the high-k dielectric material, the gate stack is usually encapsulated after the patterning process in order to avoid, or at least significantly reduce, any contact of oxygen contained in the process ambience and in neighboring material, such as silicon dioxide and the like, so as to enhance stability of the high-k dielectric material and the respective metals in the gate stack. For this purpose, silicon nitride has proven to be a promising material due to its oxygen-blocking characteristics. Hence, in typical conventional process flows, a silicon nitride liner with a thickness in the range of approximately 1-5 nm may be formed on exposed surface areas of the patterned high-k gate stack, wherein appropriate deposition techniques are used so as to not unduly affect device characteristics and/or the subsequent manufacturing steps. That is, well-established low pressure chemical vapor deposition (LPCVD) techniques for silicon nitride may require temperatures of approximately 750° C. and above in order to obtain the desired thermally activated deposition mechanism. However, at this moderately high process temperature, to which the sensitive gate stacks may have to be exposed prior to the actual deposition process, a significant degree of oxidation may occur, due to remaining oxygen residuals, and an unwanted ammonia nitridation of the exposed surfaces may also take place, which may result in highly non-uniform material characteristics of the exposed surface portions. For this reason, typical process temperatures at approximately 500° C. and less may be used for forming the silicon nitride material, which may be accomplished on the basis of sophisticated chemical vapor deposition (CVD) techniques, such as atomic layer deposition (ALD) or other cyclic deposition techniques, in which the precursor materials may be provided as a sequence of layers, wherein both precursor layers may provide a substantially self-limiting deposition behavior, as is the case in ALD strategies, thereby providing a high degree of controllability and conformality, however, at the cost of moderately long process times. Similarly, in other techniques, one of the precursor layers may not provide a self-limiting deposition behavior, yet nevertheless provide enhanced conformality and controllability due to the moderately long process times. A respective deposition technique, in which two or more precursor layers may be sequentially deposited, however, without requiring a self-limiting behavior, may be referred to herein as "multi-layer deposition." Thus, these deposition techniques may allow the deposition of a conformal and thin silicon nitride layer with a high degree of controllability. Furthermore, plasma enhanced chemical vapor deposition (PECVD) at temperatures of approximately 400-500° C. may also be used, thereby obtaining high deposition rates at low process temperatures, wherein, however, control of layer thickness may be difficult in this range of thickness, thereby rendering the PECVD technique less attractive for encapsulating high-k gate stacks. Although the sophisticated multi-layer deposition approach and the ALD technique may provide superior controllability of layer thickness, the etch selectivity of the respective silicon nitride materials with respect to wet chemical etch chemistries for etching silicon dioxide, which is frequently used during the semiconductor manufacturing flow, may be moderately low due to the moderately low deposition temperature. Similarly, PECVD silicon nitride may also exhibit a reduced etch selectivity with respect to the wet chemical etching of silicon dioxide material.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a deposition sequence for encapsulating a high-k dielectric material in a gate stack of advanced semiconductor devices, wherein the deposition sequence is designed to provide superior controllability in combination with uniform layer thickness, while also reducing the overall cycle time compared to conventional multi-layer deposition or ALD approaches, while nevertheless obtaining superior material characteristics with respect to the etch behavior of the silicon nitride material. For this purpose, the deposition of the oxygen-blocking material may include a first deposition process performed on the basis of a deposition technique that provides enhanced controllability, while also maintaining the process temperature at a moderately low level so as to substantially avoid undue oxygen incorporation and other unwanted surface reactions of exposed surface portions of the semiconductor device. Furthermore, a second portion of the oxygen-blocking material may be formed by a different deposition technique, which may be performed on the basis of a moderately high process temperature so as to provide enhanced material characteristics with respect to etch resistivity and the like, while also providing an increased deposition rate, while an undue interaction with sensitive device areas may be avoided by the previously deposited liner material. Consequently, superior overall material characteristics may be obtained at a reduced overall process time, while nevertheless maintaining controllability and layer thickness uniformity compared to conventional multi-layered deposition and ALD approaches.

One illustrative method disclosed herein comprises forming a gate stack above a semiconductor layer, wherein the gate stack comprises a high-k dielectric material and a metal-containing material formed on the high-k dielectric material. The method further comprises forming a first oxygen-blocking layer on exposed surface portions of the gate stack in a first deposition ambient at a first process temperature. Additionally, the method comprises forming a second oxygen-blocking layer on the first oxygen-blocking layer in a second deposition ambient at a second process temperature that is higher than the first process temperature.

A further illustrative method disclosed herein comprises forming a first liner by subsequently depositing at least a first precursor layer and a second precursor layer on exposed surfaces of a gate electrode stack of a semiconductor device so as to form an oxygen-blocking material, wherein the gate electrode stack comprises a high-k dielectric material. The method further comprises depositing a second liner of the oxygen-blocking material on the first liner.

One illustrative semiconductor device disclosed herein comprises a gate electrode structure formed above a semiconductor region and comprising a high-k gate insulation layer. The semiconductor device further comprises a spacer structure formed on the sidewalls of the gate electrode structure, wherein the spacer structure comprises a first silicon nitride liner that is in contact with a portion of the high-k gate insulation layer and also comprises a second silicon nitride liner formed on the first silicon nitride liner. The first and second silicon nitride liners differ in at least an etch behavior with respect to a predefined wet chemical etch chemistry.

BRIEF DESCRIPTION OF THE DRAWINGS

The disclosure may be understood by reference to the following description taken in conjunction with the accompanying drawings, in which like reference numerals identify like elements, and in which:

FIGS. 1*a*-1*b* schematically illustrate cross-sectional views of a high-k gate stack of a semiconductor device during a manufacturing sequence for forming an oxygen-blocking material, such as silicon nitride, according to illustrative embodiments;

FIG. 1*c* schematically illustrates a process reactor for processing a plurality of substrates in a first deposition sequence based on a moderately low process temperature, according to illustrative embodiments;

Figure 1D:
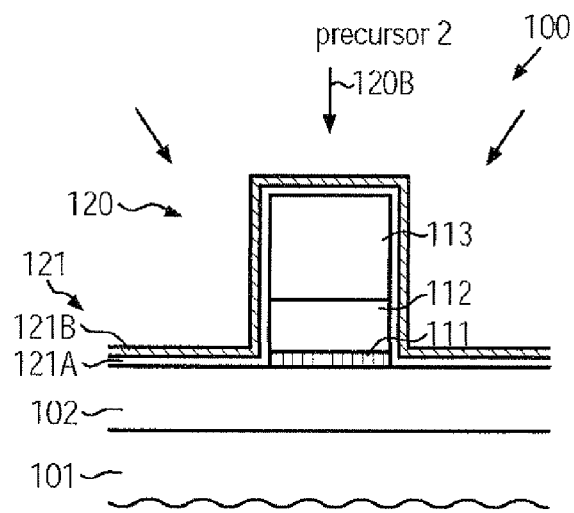
FIGS. 1*d*-1*f* schematically illustrate cross-sectional views of the semiconductor device of FIG. 1*a* in further advanced manufacturing stages in forming an oxygen-blocking material on the basis of two different process temperatures, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to the deposition of a liner material for reducing incorporation of oxygen into high-k dielectric materials of advanced metal gate stacks while also reducing unwanted surface reactions of the semiconductor device during the deposition of the liner material. To this end, the oxygen-blocking material, such as silicon nitride, may be deposited at least in two steps by using two different process temperatures, i.e., a reduced temperature for substantially avoiding oxidation of and oxygen incorporation in exposed surface areas and avoiding undue surface interaction, for instance, with respect to ammonia and other reactive components, which may be present during the deposition process, and a second higher deposition temperature for providing the desired material characteristics in view of etch resistivity and the like. In some illustrative aspects disclosed herein, the first deposition sequence may include sophisticated deposition techniques on the basis of multi-layer deposition, ALD and the like in which a thin liner may be formed with a thickness of approximately 0.2-2 nm, thereby maintaining overall process time at a moderately low level, since, in a subsequent process step, a liner material may be deposited above the passivated semiconductor device on the basis of a deposition recipe that allows increased deposition rates in combination with superior material characteristics, such as a thermally activated CVD process, which may be performed on the basis of process temperatures of approximately 700° C. and higher. In some illustrative embodiments, the different deposition recipes may be performed in the same process reactor, wherein an appropriate temperature profile may be applied so as to appropriately establish the second-higher process temperature, while avoiding undue transport activities. Thus, the process sequence as disclosed herein may provide enhanced process conditions for the thermally activated CVD process, since sensitive device surfaces are protected by the previously-formed liner, which may also act as an appropriate "seed" layer, thereby reducing any "incubation" effect as may typically be observed in LPCVD or PECVD processes, in particular when a layer of moderately reduced thickness is to be formed.

FIG. 1a schematically illustrates a cross-sectional view of a semiconductor device 100 comprising a substrate 101, above which is formed a semiconductor layer 102. The substrate 101 may represent any appropriate carrier material for forming thereabove the semiconductor layer 102, which may be provided in the form of any appropriate semiconductor material, such as silicon, germanium, silicon/germanium and the like. Furthermore, the semiconductor device 100 may comprise a gate stack 110, which may include a gate insulation layer 111 comprised of a high-k dielectric material. That is, as previously explained, the gate insulation layer 111 may comprise a material having an increased dielectric constant, for instance, 10.0 or higher, wherein a dielectric material having a dielectric constant of 10.0 or higher may be referred to herein as a high-k dielectric material. For example, the gate insulation layer 111 may comprise any of the high-k dielectrics as previously described. Furthermore, the gate stack 110 may comprise a metal-containing material 112, for instance in the form of titanium, a titanium alloy and the like, depending on the overall device requirements. As explained above, the metal-containing material 112 may have an appropriate work function as is required for establishing a desired threshold voltage of a transistor device to be formed on the basis of the gate stack 110. Moreover, in some conventional approaches, the gate stack 110 may, at least in the manufacturing stage shown, comprise a polysilicon material 113, thereby providing a high degree of compatibility with conventional approaches, in which the gate electrode may be comprised of polysilicon material. In the manufacturing stage shown, the gate stack 110 may comprise a plurality of exposed surface areas, such as the surfaces 111S, 112S, 113S, wherein at least the surface 111S may be sensitive with respect to the incorporation of oxygen, in view of the overall characteristics of the gate insulation layer 111 and the work function of the material 112, as previously explained. Furthermore, the surface 112S may also represent a highly sensitive surface area, for which a direct contact with oxygen may result in a significant variation of the overall device characteristics.

The semiconductor device 100 as shown in FIG. 1a may be formed on the basis of well-established process techniques, which may include the deposition of a high-k dielectric material, a metal-containing material and polysilicon in combination with any other material layers, such as anti-reflective coating (ARC) materials and the like, as may be required for the patterning of the gate stack 110. For this purpose, sophisticated lithography and etch techniques may be used in order to obtain the stack 110 in accordance with design rules, wherein a gate length, i.e., the horizontal extension of the gate stack 110, may be, for instance, 40 nm and less.

FIG. 1b schematically illustrates the semiconductor device 100 in a further advanced manufacturing stage. As previously discussed, the exposed surface portions of the gate stack 110 may be passivated, wherein, according to the principles disclosed herein, a deposition process may be used in which undue oxidation and other unwanted surface reactions may be significantly suppressed by maintaining a process temperature during the deposition of a liner material at approximately 550° C. and less. For this purpose, a first deposition process 120 may be used, in which a first deposition step 120A may result in the formation of a first sub-layer 121A including the first type of precursor material that may be required for the formation of the oxygen-blocking material. For this purpose, the deposition step 120A may be performed in a deposition ambient including a first precursor material, which may be provided in the form of ammonia ($NH_3$), when, for instance, silicon nitride is to be formed on the basis of ammonia and a silicon-containing gas component, such as silane, hexachloride disilane and the like. Ammonia gas may be converted into a reactive component in the form of $NH_2$ at a process temperature of approximately 500° C., which may attach in the form of the layer 121A to the exposed surface portions of the device 100. For example, on exposed silicon surfaces, respective Si—NH bonds may build up until the entire exposed surface is covered, wherein this process may be self-limiting, thereby providing enhanced process control.

FIG. 1c schematically illustrates a process reactor 150 that is configured to establish the respective gaseous ambient for the step 120A and for one or more further deposition steps of the deposition process 120. For example, the process reactor 150 may represent a furnace appropriately configured to establish a wide span of process temperatures so as to enable, in one illustrative embodiment, an in situ process, in which the deposition process 120 may be performed in the reactor 150 followed by a further deposition process to be performed at a higher process temperature, as will be described later on in more detail. The process reactor 150 may, in the embodiment shown, be configured so as to concurrently process a plurality of substrates, wherein, depending on the overall design, a plurality of temperature zones 150A, 150B, 150C may be provided, wherein each temperature zone may enable an individual adaptation of the local process temperature. In this respect, the process temperature is to be understood as the temperature of the respective temperature zones, i.e., of respective heating elements thereof, while any objects placed in the temperature zones, such as the substrates to be processed, may not necessarily have the same temperature, depending on whether or not a thermal equilibrium state is substantially reached.

For example, after loading substrates into the process reactor 150 and selecting a desired process temperature, i.e., establish a desired temperature at the heating elements of the individual temperature zones 150A, 150B, 150C, the substrates may not necessarily have the same temperature, unless a respective temperature stabilization interval may expire, during which the substrate temperature may increasingly approach the temperature of the corresponding heating elements. Hence, in some illustrative embodiments, the process temperature may be adjusted to any appropriate moderately low value of, for instance, 550° C. and less, thereby substantially avoiding undue oxidation or ammonia nitridation, prior to the introduction of precursor material, and a substantially inert ambient may be established during a respective temperature stabilization phase. Thus, upon introduction of an appropriate gaseous component, such as ammonia and the like, a respective gas flow may be established, which may result in the deposition of the sub-layer 121A (FIG. 1b), even if a certain degree of flow non-uniformities may be present in the reactor 150 during operation. Thereafter, the first precursor may be removed from the reactor 150, which may be accomplished by purging the reactor 150 with an appropriate carrier gas, such as argon, nitrogen and the like, while the process temperature may be substantially maintained.

FIG. 1d schematically illustrates the semiconductor device 100 in a further advanced stage of the deposition process 120, that is, during a second deposition step 120B, in which a second precursor material may be introduced into the reactor 150, for instance in the form of silane or a similar silicon-containing component, which may deposit on the previously formed layer 121A comprised of nitrogen and hydrogen, thereby forming a second sub-layer 121B. Depending on the overall process conditions, such as temperature, reactive gas concentration and the like, the deposition of the layer 121B may be self-limiting or may be controllable on the basis of process time and the like. Depending on the desired layer thickness, the steps 120A, 120B may be repeated, for instance, with intermediate purge steps, so as to sequentially increase the overall thickness of the resulting silicon nitride layer, which may be indicated as layer 121. For example, a thickness of 0.2 nm may be obtained on the basis of a process time of approximately 30 minutes for the steps 120A, 120B. Thus, for a thickness in the range of 0.2-2 nm, depending on the overall device requirements, a process time of approximately 30 minutes to 5 hours may be applied.

Figure 1E:
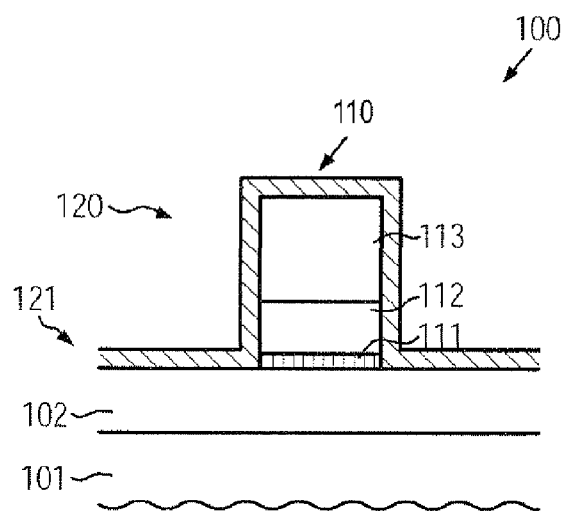

FIG. 1e schematically illustrates the semiconductor device 100 with the layer 121 having a desired thickness, for instance in the range of 0.2-2 nm, thereby appropriately passivating the exposed surface portions of the device 100 and in particular of the gate stack 110. Furthermore, during the preceding deposition process 120, undue interaction of the respective deposition ambient with the exposed surface areas may be suppressed, thereby substantially maintaining the overall characteristics of the gate insulation layer 111 and the metal-containing material 112.

Figure 1F:
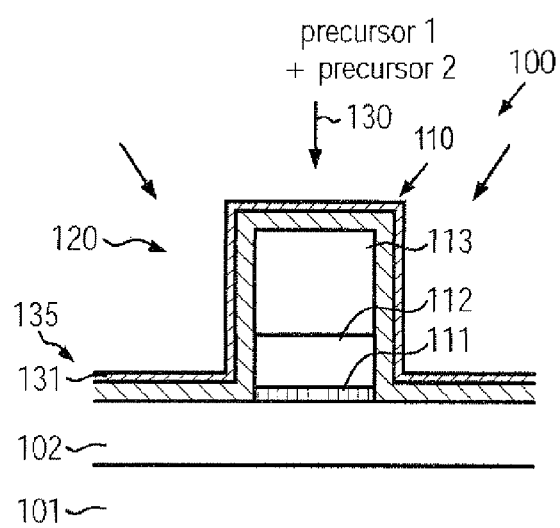

FIG. 1f schematically illustrates the semiconductor device 100 during a further deposition process 130, which may be performed on the basis of a moderately high deposition temperature as may be required for thermally activated CVD recipes for depositing a silicon nitride material. For instance, a process temperature of 700° C. and higher, for instance, approximately 740-780° C., may be established during the deposition of silicon nitride material so as to form a second liner 131 with an appropriate thickness of one to several nanometers, depending on the overall device requirements. During the CVD process 130, moderately high deposition rates may be obtained, for instance, approximately 1.6 nm per minute, which may be significantly higher compared to deposition techniques requiring a plurality of deposition cycles, as, for instance, explained above with respect to the first liner 121. Consequently, the combination of the layer 121 and the layer 131 may result in a liner 135 for encapsulating the gate stack 110, which may have superior material characteristics compared to conventional approaches using multi-layer deposition or ALD deposition techniques due to the moderately high deposition temperature for the layer 131, which may provide enhanced etch resistivity with respect to wet chemical etch recipes, as may be used for etching silicon dioxide in a later manufacturing stage. In addition, the layer 121 may result in surface passivation of the stack 110 and other exposed surface portions of the device 100 during the deposition process 130, which may result, for a desired overall thickness of the layer 135 in the range of one to several nanometers, in a significantly reduced overall process time due to the high deposition rate of the process 130, as previously explained. In some illustrative embodiments, the sequence of deposition processes 120 and 130 may be performed as an in situ process, as will be described in more detail with reference to FIGS. 1g-1h.

Figure 1G:
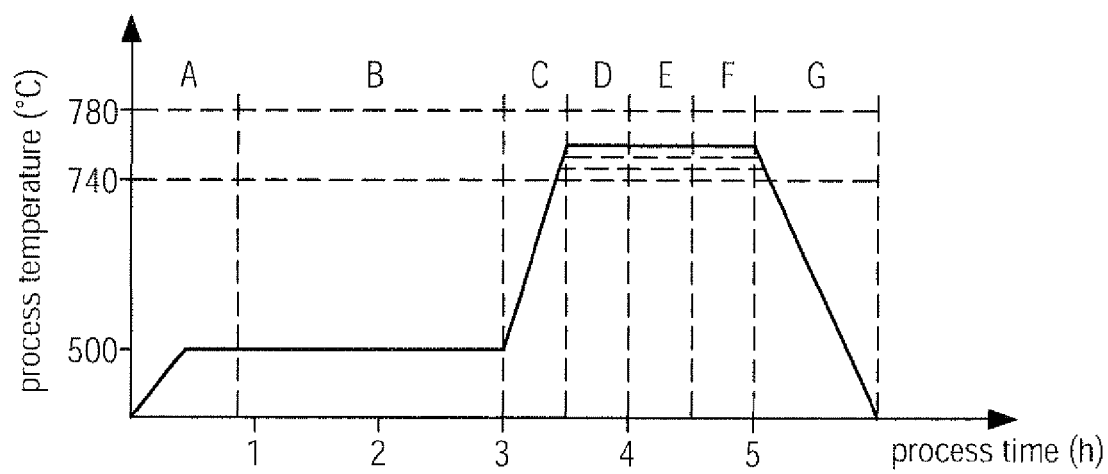
FIGS. 1*g*-1*h* schematically illustrate diagrams representing the progression of the process temperature for a combined deposition sequence on the basis of two different process temperatures, according to illustrative embodiments.

FIG. 1g schematically illustrates the progression of the process temperature, for instance of the reactor 150 (FIG. 1c) when performing the deposition processes 120 and 130 in the reactor 150. For this purpose, one or more of the substrates 101 may be loaded into the reactor 150, and a ramp-up process and a temperature stabilization step according to a time interval A may be performed. For example, an appropriate moderately low temperature, for example, approximately 500° C., may be selected. During the time interval B, the deposition process 120 may be performed by repeatedly carrying out the steps 120a, 120b, as previously described, depending on the desired layer thickness of the layer 121. Thus, the period B may include the alternating supply of respective precursor materials with intermediate purge steps, as previously described. Thereafter, the process temperature may be increased on the basis of a desired rate during a period C, after which a further temperature stabilization phase D may follow, in which the substrates 101 may be in a substantially thermal equilibrium state so as to obtain a substrate temperature that substantially corresponds to the desired process temperature. For example, as shown in FIG. 1G, a desired process temperature may be selected within a range of approximately 740-780° C. It should further be appreciated that individually adjusted process temperatures may be selected for the various temperature zones 150A, 150B, 150C, as previously explained, since a variation of process gas concentration may occur in the various temperature zones, which may result in different deposition rates unless compensated for by appropriately adjusting the individual process temperatures. That is, typically, for a thermally activated deposition process, the deposition rate may be a function of the local reactive gas concentration and the temperature. Hence, a reduced concentration may be compensated for by locally providing an increased temperature, while nevertheless maintaining the temperature within a specified allowed range, such as indicated by the range 740-780° C. It should be appreciated that other process reactors or process chambers may be used, in which less pronounced variations of the local deposition conditions may occur. For example, a reactor with a single temperature zone may be used, wherein even process chambers may be used, in which a reduced number of substrates may be processed or wherein a single substrate may be processed, if a corresponding strategy is compatible with the overall throughput of the manufacturing flow under consideration. For instance, parallel processing of a plurality of substrates may be accomplished on the basis of a plurality of individual controllable process chambers.

Thus, after the temperature stabilization step D, the actual deposition may be initiated by introducing the precursors for the process 130 during the interval E, the length of which may determine, in combination with the overall process conditions, the desired thickness of the layer 131. Thereafter, a purge step F may be performed in which the process temperature may be maintained and, thereafter, the process temperature may be decreased, according to a specified rate during the interval G, after which the substrates may be loaded from the reactor 150.

Figure 1H:
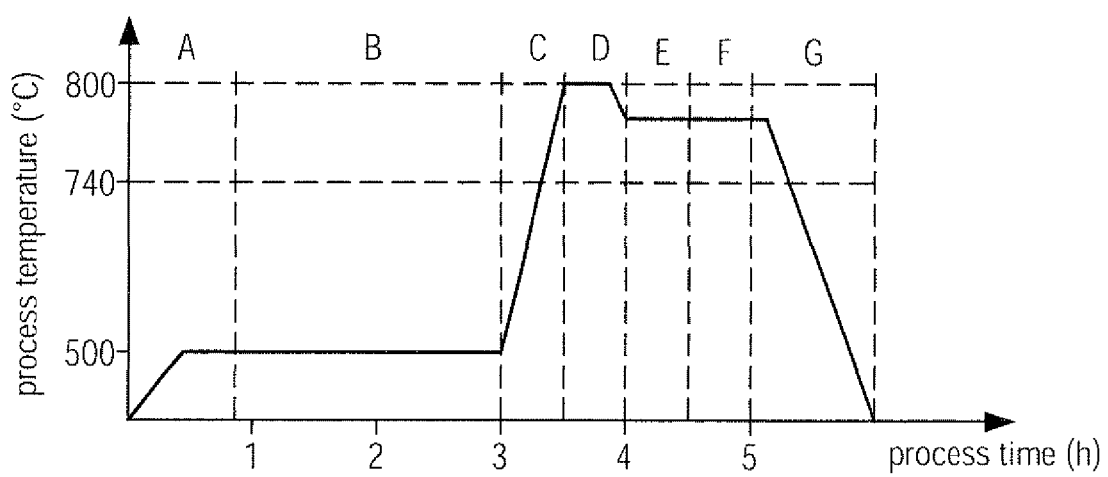

FIG. 1h schematically illustrates the progression of the process temperature during the in situ sequence of the deposition processes 120, 130, according to further illustrative embodiments, in which an enhanced across-substrate layer thickness uniformity may be achieved by reducing non-uniformities of the deposition rate during the process 130 across individual substrates. As previously explained, during the process 130, the local deposition rate is dependent on the local precursor concentration and the low temperature at or in the vicinity of the substrate surface. In a complex process reactor, as for instance is schematically illustrated in FIG. 1c, the concentration of the precursor materials may vary across the diameter of the substrates due to a gas flow from the edge to the center of the substrates, so that a reduced precursor concentration may occur at the substrate center. Consequently, for substrates being in a substantially thermal equilibrium state, a substantially constant surface temperature may be reached, which may substantially correspond to the process temperature, due to the reduced precursor concentration, a reduced deposition rate may be observed at the substrate center. In order to locally increase the deposition temperature at the substrate center, a temperature gradient may be generated during the deposition interval E by establishing a temperature profile prior to the actual deposition interval E on the basis of a pre-deposition temperature that may be higher than the process temperature during the interval E. Hence, after the process intervals A and B, which may substantially correspond to the intervals as described with reference to FIG. 1g, a ramp-up interval C may be modified so as to obtain at least one pre-deposition temperature that is above the desired process temperature range. For instance, during the ramp-up phase C, a temperature of approximately 10-50° C. above the desired process temperature range during the deposition E may be selected. Consequently, during a phase D, the pre-deposition temperature may be maintained above the process temperature, thereby achieving a temperature at the substrate centers, which may be above the actual process temperature during the phase E. Upon reducing the process temperature to the desired value, for instance within the range as previously specified, the deposition may be initiated by introducing the precursor gases, as previously explained. Due to the increased temperature of the substrate surfaces and due to the fact that the edge regions of the substrates may respond faster to the lowering of the process temperature, a temperature gradient from the substrate center to the substrate edge may be obtained and may be maintained at a more or less degree during the deposition phase E. Consequently, the gas flow induced depletion of precursor materials at the substrate center may be compensated for by the increased surface temperature. Therefore, increased across-substrate uniformity of the thickness of the layer 131 may be accomplished. Thereafter, the further processing may be continued, as previously described with reference to FIG. 1g.

Figure 1I:
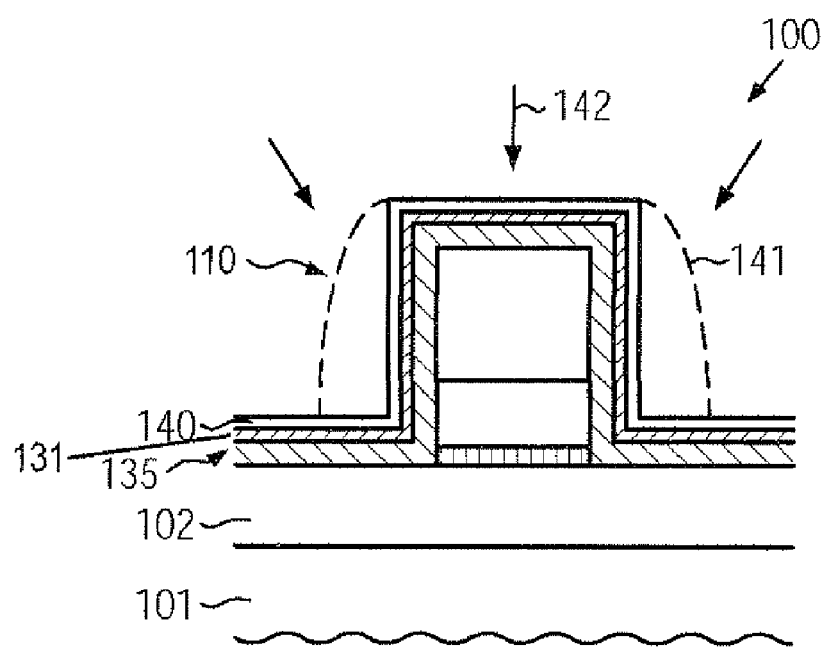
FIGS. 1*i*-1*j* schematically illustrate cross-sectional views of the semiconductor device in an advanced manufacturing stage, according to illustrative embodiments.

FIG. 1i schematically illustrates the semiconductor device 100 in a further advanced manufacturing stage, in which a further liner material 140, for instance comprised of silicon dioxide, may be formed on the oxygen-blocking material 135. The liner 140 may be provided, for instance, as an etch stop material required for the further processing of the device 100, for instance with respect to forming sidewall spacers 141, as indicated by the dashed lines. For instance, the spacers 141 may be formed on the basis of a silicon nitride material according to well-established process recipes, wherein a subsequent selective etch process may be performed, in which the liner 140 may act as an etch stop material. Thereafter, the liner 140 may be removed on the basis of well-established wet chemical etch recipes, such as hydrofluoric acid and the like, during which the material 135 may act as an efficient etch stop, wherein, in particular, the liner 131 may provide high etch resistivity to wet chemical etch recipes due to the material characteristics obtained by the high temperature deposition step 130. In other cases, during the further processing of the device 100, other silicon dioxide based layers may have to be deposited and removed upon the basis of wet chemical etch recipes and also other cleaning processes may be performed by using reactive wet chemical recipes, for which the liner 131 may provide enhanced etch stop capabilities.

The spacers 141 may be used, for instance, for the further patterning of the device 100, for instance if respective cavities are to be formed in the semiconductor layer 102, for instance for epitaxially forming a strained semiconductor material, as may typically be required in sophisticated transistor devices in order to adjust the local charge carrier mobility below the gate stack 110. In other cases, respective spacer elements may be used for defining drain and source regions, as previously explained.

Figure 1J:
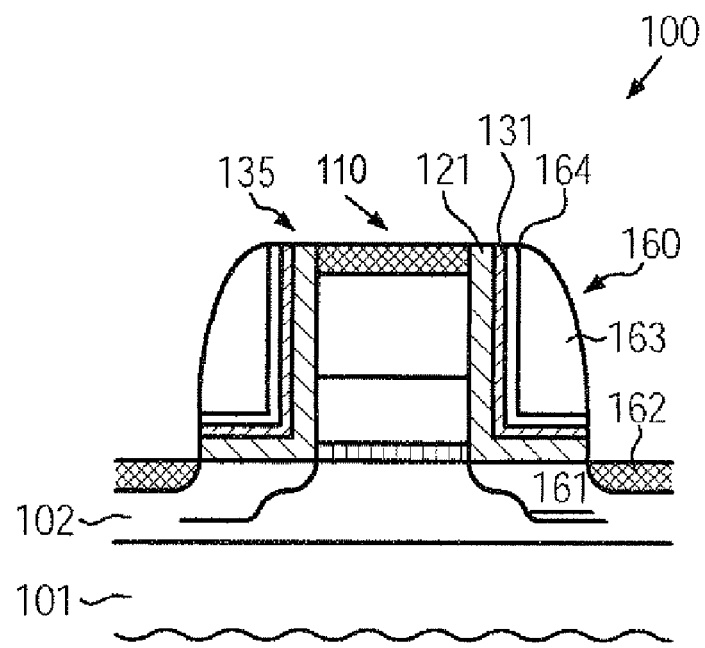

FIG. 1j schematically illustrates the semiconductor device 100 in a further advanced manufacturing stage, in which drain and source regions 161 are formed in the semiconductor layer 102, wherein the drain and source regions 161 may comprise metal silicide regions 162, depending on the overall device configuration. Furthermore, a respective metal silicide region 162 may also be formed in the gate stack 110, while, in other cases, the metal silicide may be omitted and/or the polysilicon material may have been removed, partially or completely, depending on the overall process strategy. Furthermore, a sidewall spacer structure 160 may be formed on the sidewalls of the gate stack 110, wherein the structure 160 may comprise the oxygen-blocking material 135 including the first liner 121 and the second liner 131, which may differ in their material characteristics, for instance with respect to their etch resistivity with respect to wet chemical etch recipes, such as the etch recipe 142, as previously explained. Furthermore, the spacer structure 160 may comprise a spacer element 163, which may be provided as a silicon nitride material, and may further comprise a liner 164, for instance in the form of a silicon dioxide material.

The semiconductor device 100 as shown in FIG. 1j may be formed on the basis of well-established process techniques, wherein the superior material characteristics of the oxygen-blocking material 135 may provide integrity of the gate stack 110 during various wet chemical etch processes.

As a result, the combination of a deposition process on the basis of a moderately low process temperature and of a low pressure CVD process on the basis of a moderately high process temperature may provide enhanced integrity of a gate stack including a high-k dielectric material while also providing enhanced etch resistivity during the further processing of the device. Additionally, a reduced process cycle time may be accomplished compared to conventional ALD-based or multi-layer deposition-based approaches due to the significantly increased deposition rate of the CVD process for forming the outer portion of an oxygen-blocking material, such as silicon nitride.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate stack above a semiconductor layer, said gate stack comprising a high-k dielectric material and a metal-containing material formed on said high-k dielectric material
    forming a first oxygen-blocking layer on exposed surface portions of said gate stack in a first deposition ambient at a first process temperature; and
    forming a second oxygen-blocking layer on said first oxygen-blocking layer in a second deposition ambient at a second process temperature that is higher than said first process temperature, wherein said first and second deposition ambients are established in the same process reactor, and wherein establishing said second deposition ambient comprises discontinuing supply of first precursor materials after forming said first oxygen-blocking layer on the basis of said first precursor materials, heating said process reactor at a specified rate up to a pre-deposition temperature that corresponds to said second process temperature, maintaining said pre-deposition temperature for a specified stabilization period and supplying second precursor materials to form said second oxygen-blocking layer.

2. A method, comprising:
    forming a gate stack above a semiconductor layer, said gate stack comprising a high-k dielectric material and a metal-containing material formed on said high-k dielectric material;
    forming a first oxygen-blocking layer on exposed surface portions of said gate stack in a
    first deposition ambient at a first process temperature; and
    forming a second oxygen-blocking layer on said first oxygen-blocking layer in a second deposition ambient at a second process temperature that is higher than said first process temperature, wherein said first and second deposition ambients are established in the same process reactor, and wherein establishing said second deposition ambient comprises discontinuing supply of first precursor materials after forming said first oxygen-blocking layer on the basis of said first precursor materials, heating said process reactor at a specified rate up to a pre-deposition temperature that is higher than said second process temperature, maintaining said pre-deposition temperature above said second process temperature for a specified overheating period and supplying second precursor materials at said second process temperature to form said second oxygen-blocking layer.

3. The method of claim 1 or 2, wherein said first oxygen-blocking layer is comprised of silicon nitride.

4. The method of claim 3, wherein said second oxygen-blocking layer is comprised of silicon nitride.

5. The method of claims 1 or 2, wherein forming said first oxygen-blocking layer comprises depositing a first sub-layer including a first precursor and depositing a second sub-layer including a second precursor, wherein said first and second precursors react to form at least a portion of said first oxygen-blocking layer.

6. The method of claim 5, wherein said first process temperature is approximately 550° C. or less.

7. The method of claim 5, wherein forming said second oxygen-blocking layer comprises performing a thermally activated chemical vapor deposition process.

8. The method of claim 7, wherein said second process temperature is approximately 700° C. or higher.

\* \* \* \* \*